United States Patent [19]

Mallinson

[11] Patent Number: 4,980,634

[45] Date of Patent: Dec. 25, 1990

[54] ELECTRIC POWER MEASURING SYSTEM

[75] Inventor: Andrew M. Mallinson, Billerica, Mass.

[73] Assignee: Analog Devices, Inc., Norwood, Mass.

[21] Appl. No.: 394,054

[22] Filed: Aug. 15, 1989

[51] Int. Cl.$^5$ .................. G01R 7/12; G01R 21/06; G01R 21/133

[52] U.S. Cl. ................................ 324/142; 324/141; 364/483

[58] Field of Search ............... 324/99 D, 99 R, 142, 324/141; 341/138, 139, 162–165; 364/483, 492

[56] References Cited

U.S. PATENT DOCUMENTS

| | | | |
|---|---|---|---|
| 4,255,707 | 3/1981 | Miller | 324/142 |
| 4,556,870 | 12/1985 | Brokaw et al. | 341/134 |
| 4,594,576 | 6/1986 | Fujii | 341/138 |
| 4,628,257 | 12/1986 | Kusters et al. | 324/142 |
| 4,716,361 | 12/1987 | Sheffer | 324/679 |
| 4,794,369 | 12/1988 | Haferd | 324/142 |

Primary Examiner—Reinhard J. Eisenzopf
Assistant Examiner—William J. Burns
Attorney, Agent, or Firm—Parmelee, Bollinger & Bramblett

[57] ABSTRACT

An electric power measuring system wherein the current and voltage components are converted to respective digital signals which are multiplied and integrated to obtain a measurement of total power consumed. The current signal is developed by an A-to-D converter of the successive-approximation type, but differing from conventional such converters in employing two (or more) DACs in the feedback path where the analog feedback signal is developed for comparison with the analog current measurement signal. The two DACs are interconnected in such a way that the feedback signal is proportional to the square of the digital signal produced by the successive-approximation register (SAR). The final digital signal is developed by squaring the digital output of the SAR. The result is increased resolution at the low-level end of the scale, making it possible (in the particular embodiment) to achieve 1% accuracy at 1% of full scale, as well as 1% accuracy at 100% of full scale.

12 Claims, 1 Drawing Sheet

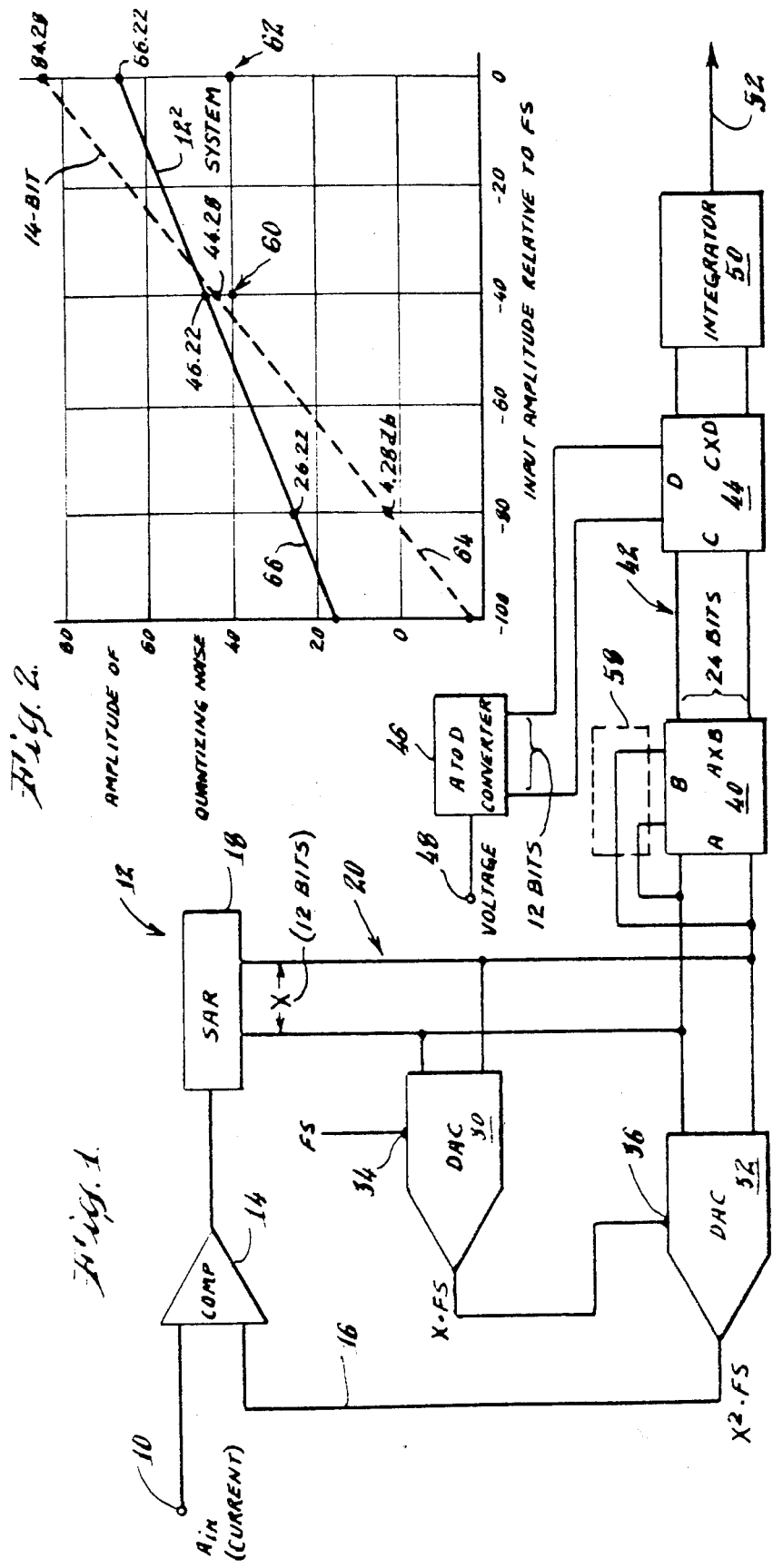

ELECTRIC POWER MEASURING SYSTEM

BACKGROUND OF THE INVENTION

1. Field of the Invention

This invention relates to electric power measuring apparatus. More particularly, this invention relates to analog-to-digital (A-to-D) converters useful in systems for measuring the consumption of electric power, for example, power delivered to a home by an electric utility.

2. Description of the Prior Art

Electric power delivered to homes or commercial buildings has for many years commonly been measured by means of a well-known electro-mechanical type of integrating meter incorporating a rotating disc. Such meters have found widespread and long time use because they not only are highly accurate but also are relatively inexpensive to manufacture. However, they have an important disadvantage in not being capable of readily interfacing with and/or taking advantage of modern digital data systems. Consequently, there has developed a need for an electric power meter which is essentially electronic in nature, particularly in being able to produce digital output signals accurately reflecting power consumption.

It has been proposed that the magnitudes of the voltage and current supplied to a customer be sampled periodically at a relatively high frequency, and converted to respective digital signals as by the use of known A-to-D converters. These digital signals would then be multiplied in conventional fashion and integrated over time to provide total power consumption. This approach is theoretically workable, but because of the stringent accuracy requirements applicable to electric power measurement, the employment of A-to-D converters using known technology would lead to undesirably high manufacturing costs.

In more detail, the accuracy specifications for electric power meters typically require that a measurement at full-scale power be accurate to 1%, and that a measurement at 1% of full-scale power also be accurate to 1%. Achieving an accuracy of 1% at 100% of full scale is well within the capability of present day A-to-D converters. However, for such equipment also to provide an assured accuracy of 1% at the other end of the range, that is, at only 1% of full scale, is a very severe requirement. It has, for example, been calculated that achieving such an accuracy would require a very high quality A-to-D converter with a 16-bit resolution. Although such devices can be made, they are intricate in design and costly to make.

The accuracy problem is particularly acute with respect to making measurements of the electric current component of the power being consumed, because the current being drawn can vary anywhere from zero to full-scale value. On the other hand, measurement of the voltage component is relatively easier, since generally the voltage will be maintained within 10% or so of a preset magnitude such as 110 volts. Thus a conventional A-to-D converter of a relatively limited bit resolution, such as 10 or 12 bits, will be capable of providing adequate resolution for measuring the voltage component.

It is a principal object of this invention to provide apparatus and techniques capable of making highly accurate electric power measurements in a digital signal format at relatively modest cost.

SUMMARY OF THE INVENTION

In a presently preferred embodiment of the invention, to be described hereinafter in detail, there is provided an electric power measuring system wherein the electrical current magnitude is sampled periodically and converted to digital signals by an A-to-D converter of the successive-approximation type. As is well known, that type of converter employs a search algorithm means, such as a successive-approximation register (SAR), driven by the output of an analog signal comparator and operable to develop a patterned sequence of digital signals as the input for a digital-to-analog (D-to-A) converter, or DAC. This D-to-A converter forms part of a feedback path leading back to the input of the analog signal comparator. That is, the analog output of the D-to-A converter is directed to the comparator input to be compared to the analog input signal representing the electric current being measured.

The output of the comparator controls the SAR in known fashion while the SAR carries out its search algorithm. At the end of the programmed sequence, the digital signal applied to the D-to-A converter produces at the output of that converter an analog signal which is essentially equal to the analog input signal applied to the comparator, and which in turn corresponds to the magnitude of the electric current being measured. At that balance point, therefore, the output of the SAR is a digital number having a value corresponding to the electric current being measured.

The A-to-D converter disclosed herein for measuring electric current differs from conventional successive-approximation designs, and is capable of producing at the low-current end of its range a digital signal with a resolution which is substantially higher than the resolution achievable by a conventional A-to-D converter, while yet employing non-critical D-to-A converter means in its feedback path. In one particular embodiment of the invention to be described, the A-to-D converter develops a 24-bit digital output signal while using in the feedback path D-to-A conversion means having only a 12-bit resolution. 12-bit D-to-A converters are readily available in the marketplace, so that an electric power measuring system utilizing the invention can be had at modest cost.

In the particular embodiment of this new A-to-D converter, the feedback path for the digital output of the SAR comprises two interconnected D-to-A converters (both of 12-bit resolution, in the disclosed embodiment) which simultaneously receive at their inputs the digital signals from the SAR. One of these D-to-A converters is supplied with a fixed reference voltage, so that its analog output is simply proportional to the magnitude of the digital signal developed by the SAR. The analog output of that converter is in turn connected to the reference signal terminal of the other D-to-A converter. Thus the analog output of that other converter is made to be proportional to the square of the digital signal developed by the SAR, i.e. the analog feedback signal supplied to the analog signal comparator is non-linearly related to the digital number developed by the SAR.

This non-linearity in the successive-approximation feedback path results in increased digital resolution at the low-level (i.e. low-current) end of the range of the converter. As a consequence, it becomes possible to achieve the desired 1% accuracy at 1% of full-scale power, and yet the same apparatus also still is capable of achieving 1% accuracy at 100% of full scale. The final digital output signal corresponding to the measured electric current magnitude is derived by squaring the 12-bit output of the SAR, to produce a 24-bit signal representing the magnitude of the electric current.

These output digital signals representing the sampled magnitudes of the electric current are in turn multiplied by corresponding digital signals representing the electric voltage at the sample instants. The successive products of this multiplication are integrated over time to produce a measure of total power consumed.

Accordingly, it is an object of the present invention to provide a superior electric power measuring system. Another object of the invention is to provide such a system which can be manufactured at reasonable cost. Still another object of the invention is to provide an A-to-D converter of the successive-approximation type which is capable of producing in a pre-selected segment of its range a high-resolution output signal without requiring a high-resolution D-to-A converter in the feedback path of the A-to-D converter. Still other objects, aspects and advantages of the invention will be pointed out in, or apparent from, the following detailed description of a presently preferred embodiment, considered together with the accompanying drawings.

BRIEF DESCRIPTION OF THE DRAWINGS

FIG. 1 presents a schematic diagram illustrating a presently preferred electric power measurement system in accordance with the invention, including an A-to-D converter of the successive-approximation type having non-linear feedback; and FIG. 2 is a graph showing relationships important to the functioning of the invention.

DETAILED DESCRIPTION OF A PREFERRED EMBODIMENT

Referring first to the upper-left-hand corner of the drawing, the electric power measuring apparatus disclosed includes an input terminal 10 to which is applied an analog input signal $A_{in}$ to be converted to a digital signal. This analog input signal represents the magnitude of an electric current in a power line, for example a line supplying 60 Hz alternating-current electric power to a residential house. The current magnitude is sampled at a relatively high frequency, such as 10 kHz, e.g. as by means of a conventional sample/hold device (not shown). The sample signal is held at the input terminal 10 for a sufficient time to allow the analog-to-digital conversion system to complete a measurement cycle, as will be described. Each measurement cycle may take 50 $\mu$seconds, comprising for example 25 $\mu$seconds for a conventional auto-zero function, and 25 $\mu$seconds for the actual analog-to-digital conversion.

The current signal $A_{in}$ is directed to an A-to-D converter generally indicated at 12. This converter is of the successive-approximation type, and has a structure generally similar to known successive-approximation converters, as shown for example in U.S. Pat. No. 4,556,870 issued to Brokaw et al.

As in the usual successive-approximation converter, the analog input signal $A_{in}$ is directed to a comparator 14 together with another analog signal from a feedback signal line 16. The binary output of the comparator is supplied to a means for carrying out a search algorithm, which in the specific embodiment is a conventional successive-approximation register (SAR) 18. This device produces a 12-bit digital output signal on its output lines 20 (this digital output signal being referred to herein as "X"). The SAR is programmed in known fashion to carry out a search algorithm seeking the digital output signal which corresponds to the analog input signal $A_{in}$.

The digital output signal "X" of the SAR 18 is fed in parallel to the inputs of two 12-bit DACs 30, 32 of known construction. The upper DAC 30 receives at its reference input terminal 34 a voltage signal of fixed magnitude (as in a conventional successive-approximation converter). Thus the analog output signal of this DAC is simply proportional to the product of the reference voltage FS (standing for full-scale) and the digital input signal X. That is, the analog output of the DAC 30 is proportional to X·FS.

The second DAC 32 receives at its reference input terminal 36 the output analog signal from the first DAC 30. Thus, the second DAC functions as a multiplying DAC, producing an analog output signal proportional to the product of X and X·FS, or $X^2$·FS.

It thus will be seen that, after the search algorithm of the SAR 18 has been completed, the final value of X will be linearly proportional to the square root of the current measurement signal $A_{in}$. Accordingly, to derive the digital signal which corresponds to the current measurement signal ($A_{in}$), the final digital output X need only be squared (as by a digital multiplier shown at 40, where X is supplied to both the A and B inputs) The output $X^2$ of this multiplier is a 24-bit signal on lines 42. Since the original digital signal before squaring was a 12-bit signal with 4096 possible codes, the 24-bit output signal also has only 4096 distinct outputs.

It turns out that these 4096 different outputs on lines 42 are not distributed evenly across the span of all possible 24-bit digital numbers. Because of the non-linearity resulting from the $X^2$ feedback for the A-to-D converter, the 4096 distinct outputs are compressed and concentrated more at the low-level end of the scale; that is, the spacing between the distinct numbers is smallest near the zero output level and greatest near the full-scale output level. The consequence is that the resolution achievable by the A-to-D converter is in effect magnified at the low-level end of the scale. It has been found that this non-linear effect makes it possible to achieve the desired measurement accuracy of 1% at 1% of full scale, while still achieving with the same apparatus an accuracy of 1% at 100% of full scale.

With the magnitude of the electric current component ($A_{in}$) established in the 24-bit signal on lines 42, the next step in determining the electric power is to multiply this number by a digital number representing the magnitude of the voltage component at the sample instant. This is illustrated by the digital multiplier 44 which receives at its C input the 24-bit current signal and at its D input a 12-bit signal representing the voltage component. This 12-bit signal is shown as derived from an A-to-D converter 46 having an input terminal 48 to which a voltage signal is applied. This converter can, for example, be a successive-approximation converter. However, it need not be a very high resolution converter, and is illustrated here as providing a 12-bit output signal.

The product of the current and voltage digital signals is directed from multiplier 44 to an integrator schematically illustrated at 50. This device can be conventional in design, and operates to sum the signals from the multiplier 44 to produce a final digital signal measurement 52 of total power consumed.

The benefits of the invention can be understood analytically by calculations of the quantization noise as a function of current level being measured. It can be shown that the quantizing error ($Q_n$) can be expressed as:

$$Y = 6.02N - 20(\log P + X/P)$$

where:
- Y = quantizing error in dB
- N = bits in DACs (12 in the above example)
- X = current level ($A_{in}$) in dB below full scale
- P = order of DACs in feedback (2, in the above example)

By use of this relationship, it can be established that the system disclosed herein is capable of meeting the specification of 1% accuracy at 1% of full-scale power level and 1% accuracy at 100% of full-scale power level.

FIG. 2 shows this relationship graphically. The point representing 1% accuracy at 1% of full scale is indicated at 60, and the point representing 1% accuracy at 100% of full scale is indicated at 62. The dashed line 64 represents the characteristics of a 14-bit A-to-D converter of conventional design, and as shown is just barely capable of satisfying the specified 1% accuracy at 1% of full scale. The solid line 66 represents the characteristics of the above-described 12-bit system, and it can be seen that it comfortably meets the 1% accuracy specifications.

Other apparatus arrangements are possible. For example, three or more DACs could be employed in the feedback path, in the same kind of multiplying relationship. For example, in a three-DAC arrangement, one could provide an output of X·FS to be applied to the reference input of the second, and the output of the second ($X^2 \cdot FS$) could be applied to the reference input of the third. This would result in the output of the third DAC being proportional to $X^3$. The final output digital signal would then be derived by cubing X.

Also, DACs having different bit resolutions, e.g. 10 or 11 bits, could be employed in the feedback path and yet still achieve satisfactory results. In addition, the digital data could be manipulated for special effects. For example, the B input of the multiplier 40 could include a latch 58 as shown in dotted outline, in order to hold that digital signal for one cycle, or a part of a cycle, e.g. in order to achieve an interpolation effect.

Still another rearrangement could include use of the same A-to-D converter apparatus for making both the current and the voltage measurements, as by means of a time-sharing multiplexed configuration. For example, the A-to-D converter 12 could be used alternately for voltage measurements simply by switching out the upper DAC 30 and applying the fixed reference voltage FS to the reference terminal of the DAC 32 during that portion of the cycle. The digital signals for the current and voltage components could be switched to respective channels as part of the multiplexing operation, and subsequently multiplied to develop a signal proportional to power.

Although specific preferred embodiments of the invention have been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An electric power measuring system wherein current and voltage signal components in analog format are converted to respective digital signals to be multiplied and integrated;
   said system including, for converting the current component signal to a digital signal, an A-to-D converter of the successive-approximation type comprising:
   a comparator to receive the current signal together with an analog feedback signal;
   search algorithm means responsive to the output of said comparator and operable in accordance with a search algorithm to produce a programmed sequence of digital signals; and
   D-to-A converter means receiving said sequence of digital signals and producing corresponding analog feedback signals for comparison with said current signal component so as to control the operation of said search algorithm means;
   said D-to-A converter means comprising means to produce said analog feedback signals in accordance with a non-linear relationship with respect to said digital signals from said search algorithm means, thereby producing a final digital signal from said search algorithm means having said non-linear relationship with respect to said current component signal.

2. A system as in claim 1, wherein said D-to-A converter means comprises at least two DACs both receiving said sequence of digital signals and interconnected to produce said analog feedback signals with said non-linear relationship.

3. A system as in claim 2, wherein said two DACs are interconnected such that said feedback signals are proportional to the square of the corresponding digital signals.

4. A system as in claim 3, wherein one of said DACs is supplied with a fixed reference signal; and
   means connecting the output of said one DAC to the reference terminal of the other DAC.

5. A system as in claim 1, including means to operate on said final digital signal in accordance with said non-linear relationship so as to produce a final digital output signal linearly related to said current component signal.

6. A system as in claim 5, wherein in accordance with said non-linear relationship, said final digital signal is proportional to the square-root of said current component signal; and
   said means to operate on said final digital signal comprises squaring means.

7. A system as in claim 6, including means to develop a digital signal corresponding to a voltage component;
   means to multiply said voltage component digital signal and the output of said squaring means; and
   means to integrate successive outputs of said multiplying means to produce a measure of total power consumed.

8. An electric power measuring system wherein a current signal initially in analog format is to be multiplied with a voltage signal to provide a measure of power;
   said system including, for converting said analog-format current signal to a digital signal prior to its multiplication with said voltage signal, an A-to-D converter of the successive-approximation type comprising:

a comparator to receive said current signal together with an analog feedback signal;

search algorithm means responsive to the output of said comparator and operable in accordance with a search algorithm to produce a programmed sequence of digital signals; and D-to-A converter means receiving said sequence of digital signals and producing corresponding analog feedback signals for comparison with said current signal so as to control the operation of said search algorithm means;

said D-to-A converter means comprising means to produce said analog feedback signals in accordance with a non-linear relationship with respect to said digital signals from said search algorithm means thereby producing a digital output signal from said search algorithm means having said non-linear relationship with respect to said current signal.

9. A system as in claim 8, including means to convert said non-linear digital output signal to a digital signal which is linearly proportional to said current signal component;

said non-linear relationship providing for higher resolution near the zero output level of said linear digital signal.

10. A system as in claim 9, including means to multiply said linear digital signal by a signal corresponding to said voltage signal component.

11. A system as in claim 10, including means to provide said voltage signal in digital format.

12. A system as in claim 10, including means to integrate the signal developed by said multiplication.

* * * * *